(12) United States Patent
Ikezaki

(10) Patent No.: US 7,098,704 B2
(45) Date of Patent: Aug. 29, 2006

(54) SEMICONDUCTOR INTEGRATED CIRCUIT DEVICE

(75) Inventor: Masahiro Ikezaki, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/860,482

(22) Filed: Jun. 4, 2004

(65) Prior Publication Data

US 2005/0012535 A1    Jan. 20, 2005

(30) Foreign Application Priority Data

Jun. 5, 2003    (JP)    ............................. 2003-161035

(51) Int. Cl.
    *H03B 1/00*    (2006.01)
(52) U.S. Cl. ......................... 327/112; 327/108; 326/87
(58) Field of Classification Search ................ 327/112; 326/87
    See application file for complete search history.

(56) References Cited

U.S. PATENT DOCUMENTS 4,961,010 A * 10/1990 Davis ......................... 326/27
5,003,205 A * 3/1991 Kohda et al. ................. 326/83
6,351,172 B1 * 2/2002 Ouyang et al. ............. 327/112

FOREIGN PATENT DOCUMENTS

| EP | 0 292 641 | 11/1988 |
|----|-----------|---------|
| JP | 2633562 | 4/1997 |
| JP | 2001-244802 | 9/2001 |

* cited by examiner

*Primary Examiner*—Long Nguyen
(74) *Attorney, Agent, or Firm*—Oblon, Spivak, McClelland, Maier & Neustadt, P.C.

(57) ABSTRACT

A semiconductor integrated circuit device with a buffer circuit is disclosed, which comprises a pre-buffer configured to receive an input signal from a front-stage circuit, a drive buffer having a first PMOS transistor and a first NMOS transistor connected in series between a power supply node and a ground node, the first PMOS and NMOS transistors having gates for receiving an output signal of the pre-buffer, a series-connection node of the first PMOS and NMOS transistors being connected to the output node, and a back-up buffer having a second PMOS transistor and a second NMOS transistor connected in series between the power supply node and the ground node, a series-connection node of the second PMOS and NMOS transistors being connected to the output node, one of the second PMOS and NMOS transistors is turned on after the other is turned off when the drive buffer is in a switching operation.

8 Claims, 5 Drawing Sheets

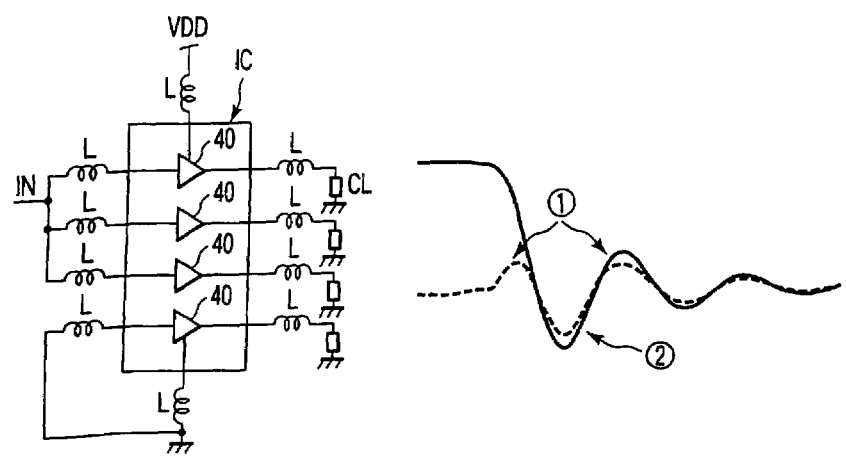
FIG. 4
Prior Art
FIG. 5
Prior Art
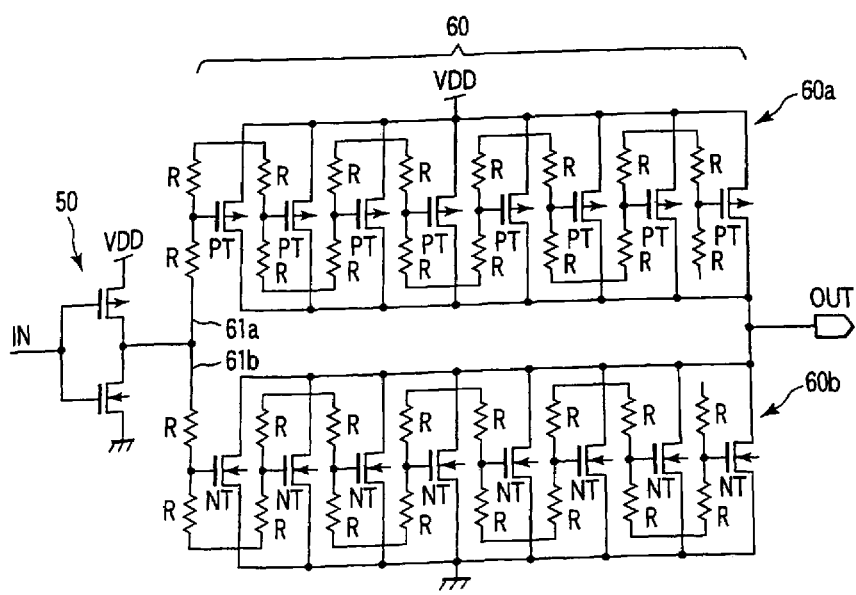
FIG. 6
Prior Art

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2003-161035, filed Jun. 5, 2003, the entire contents of which are incorporated herein by reference.

BACKGROUND OF THE INVENTION

1. Field of the Invention

The present invention relates to a semiconductor integrated circuit device. In particular, the present invention relates to a CMOS (complementary insulated gate) output buffer circuit, which is used for a semiconductor memory such as a DRAM.

2. Description of the Related Art

In general, when simultaneously outputting a multi-bit signal from a semiconductor integrated circuit (hereinafter, referred to as an IC or LSI) including a plurality of output buffer circuits, consideration must be given to the influence of switching noise generated when output buffer circuits switch simultaneously.

FIG. 4 shows a conventional IC package model including a plurality of CMOS output buffer circuits 40. FIG. 5 shows waveforms ① and ② of switching noise generated when a plurality of output buffer circuits switch simultaneously in the fall of an input signal IN.

In the output buffer circuit 40, p-channel and N-channel buffers connected in series between a power supply node (VDD node) and a ground node are complementarily turned on by the input signal IN. In FIG. 4, L is parasitic inductance of external wiring of an IC package, and CL is load capacitance.

When a plurality of output buffer circuits 40 simultaneously switch, the corresponding capacitive load connected to a plurality of output terminals is charged and discharged. Thus, rapid current variations occur in the transient state when the output buffer circuit 40 makes the switching operation.

This is a factor of generating the following switching noise. More specifically, the switching noise (waveform ②) is generated in the output signal resulting from the foregoing parasitic inductance L. The switching noise (waveform ①) is generated in the potential of the ground terminal. The higher the drive capability of the output buffer circuit 40 is, the greater the switching noise becomes. As a result, a remarkable influence is had on the inside and outside of the IC. In order to reduce the switching noise, a slew rate control (SRC) circuit is employed.

FIG. 6 shows an equivalent circuit diagram of a typical output buffer circuit formed using the SRC circuit when the output buffer circuit 40 of FIG. 4 requires high drive capability.

The SRC circuit comprises a CMOS pre-buffer 50 receiving an input signal from a first-stage circuit and an output buffer 60 driven by the output signal of the pre-buffer 50. The output buffer 60 comprises P-channel and N-channel buffers 60a and 60b, which are connected between a VDD node and a ground node. The P-channel buffer 60a is composed of a plurality of PMOS transistors PT, which are connected in parallel, and individually have a gate connected to a polysilicon gate interconnection (wiring) 61a. The N-channel buffer 60b is composed of a plurality of NMOS transistors NT, which are connected in parallel, and individually have a gate connected to a polysilicon gate interconnection 61b. In this case, CR delay effect of gate capacitance C of multi-stage PMOS and NMOS transistors PT and NT and polysilicon resistance R parasitic to polysilicon gate interconnections 61a and 61b is used. Using the CR delay effect, multi-stage PMOS and NMOS transistors PT and NT of the output buffer 60 are stepwise turned on by the output of the pre-buffer 50, and thereby, current variations are softened.

However, the SRC circuit has the conflicting relationship between switching noise and propagation delay time as described below.

FIG. 7 shows an equivalent circuit of the SRC circuit shown in FIG. 6 to which propagation path nodes of the input signal IN are added. FIG. 8 is a view to explain the delay propagation operation with respect to multi-stage PMOS and NMOS transistors PT and NT of the output buffer when the input signal IN rises.

The SRC circuit shown in FIG. 7 intentionally delays potential propagation in the termination node of input nodes a, b, c, d and e corresponding to multi-stage PMOS and NMOS transistors PT and NT of the output buffer 60. Therefore, when the switching operation is made, a state in which P-channel and N-channel buffers 60a and 60b simultaneously turned on continues for a long time. In addition, when switching rush current increases, the carrying period simultaneously becomes long. As a result, the switching operation time of the SRC circuit becomes slow; for this reason, this remarkably influences propagation delay time.

FIG. 9 is an equivalent circuit diagram showing a modification example of the SRC circuit shown in FIG. 7. FIG. 10 is a waveform chart to explain the operation when the input signal IN falls.

The SRC shown in FIG. 9 has the circuit connection described below. Multi-stage PMOS and NMOS transistors PT and NT of the output buffer 60 are divided into a plurality of unit groups. In each group, input signal propagation delay time becomes equal, and potential propagation is delayed in the termination node, that is, input nodes a and e of each group.

In view of the propagation delay time of the SRC circuit, the SRC circuit reduces it to some degree; however, the effect of reducing switching noise is not so expected.

JPN. PAT. APPLN. KOKAI Publication No. 2001-244802 discloses the following buffer circuit. The buffer circuit includes two switching elements, two auxiliary switching elements and drive changeover (switching) control section. The two switching elements are connected in series to a power source, exclusively make on/off changeover by an input signal, and output the output signals from a common connection node. The foregoing two auxiliary switching elements are connected in parallel correspondingly to two switching elements. The drive changeover control section outputs a drive auxiliary control signal for turning on the auxiliary switching elements by predetermined time in accordance with a level change of the input signal.

As described above, the CMOS output buffer circuit simultaneously outputs a plurality of bit signal in a conventional LSI. The CMOS output buffer circuit is greatly influenced by switching noise. If the SRC circuit is used in order to reduce the switching noise, switching time becomes slow. As a result, there is a problem of influencing the propagation delay time of the LSI.

BRIEF SUMMARY OF THE INVENTION

According to an aspect of the present invention, there is provided a semiconductor integrated circuit device with a CMOS buffer circuit comprising:

an input node and an output node;

a pre-buffer configured to receive an input signal from a front-stage circuit through the input node;

a drive buffer having a first PMOS transistor and a first NMOS transistor connected in series between a power supply node and a ground node, the first PMOS transistor and the first NMOS transistor having gates for receiving an output signal of the pre-buffer, a series-connection node of the first PMOS transistor and the first NMOS transistor being connected to the output node; and a back-up buffer having a second PMOS transistor and a second NMOS transistor connected in series between the power supply node and the ground node, a series-connection node of the second PMOS transistor and the second NMOS transistor being connected to the output node, one of the second PMOS transistor and the second NMOS transistor is turned on after the other of the second PMOS transistor and the second NMOS transistor is turned off when the drive buffer is in a switching operation.

According to another aspect of the present invention, there is provided a semiconductor integrated circuit device with a three-state type CMOS output buffer comprising:

an input node and an output node;

a pre-buffer having a NAND gate circuit and a NOR gate circuit, the NAND gate circuit being inputted with an input signal from a front-stage circuit through the input node and an output enable signal, and the NOR gate circuit being inputted with an inversion signal of the output enable signal and the input signal;

a drive buffer having a first PMOS transistor and a first NMOS transistor connected in series between a power supply node and a ground node, the first PMOS transistor having a gate for receiving an output signal of the NAND gate circuit of the pre-buffer, the first NMOS transistor having a gate for receiving an output signal of the NOR gate circuit of the pre-buffer, a series-connection node of the first PMOS transistor and the first NMOS transistor being connected to the output node; and a back-up buffer having a second PMOS transistor and a second NMOS transistor connected in series between the power supply node and the ground node, a series-connection node of the second PMOS transistor and the second NMOS transistor being connected to the output node, one of the second PMOS transistor and the second NMOS transistor is turned on after the other of the second PMOS transistor and the second NMOS transistor is turned off when the drive buffer is in a switching operation.

BRIEF DESCRIPTION OF THE SEVERAL VIEWS OF THE DRAWING

FIG. 4 is a view to explain the configuration of a conventional package model including a plurality of CMOS output buffer circuits;

FIG. 5 is a waveform chart of the circuit shown in FIG. 4 to explain switching noise generated when input signal falls and a plurality of output buffer circuits simultaneously make a switching operation in the fall of an input signal IN.

FIG. 6 is an equivalent circuit diagram showing a typical output buffer circuit formed using a SRC circuit when the output buffer circuit of FIG. 4 requires high drive capability;

DETAILED DESCRIPTION OF THE INVENTION

Embodiments of the present invention will be described below with reference to the accompanying drawings.

FIRST EMBODIMENT

Figure 1:
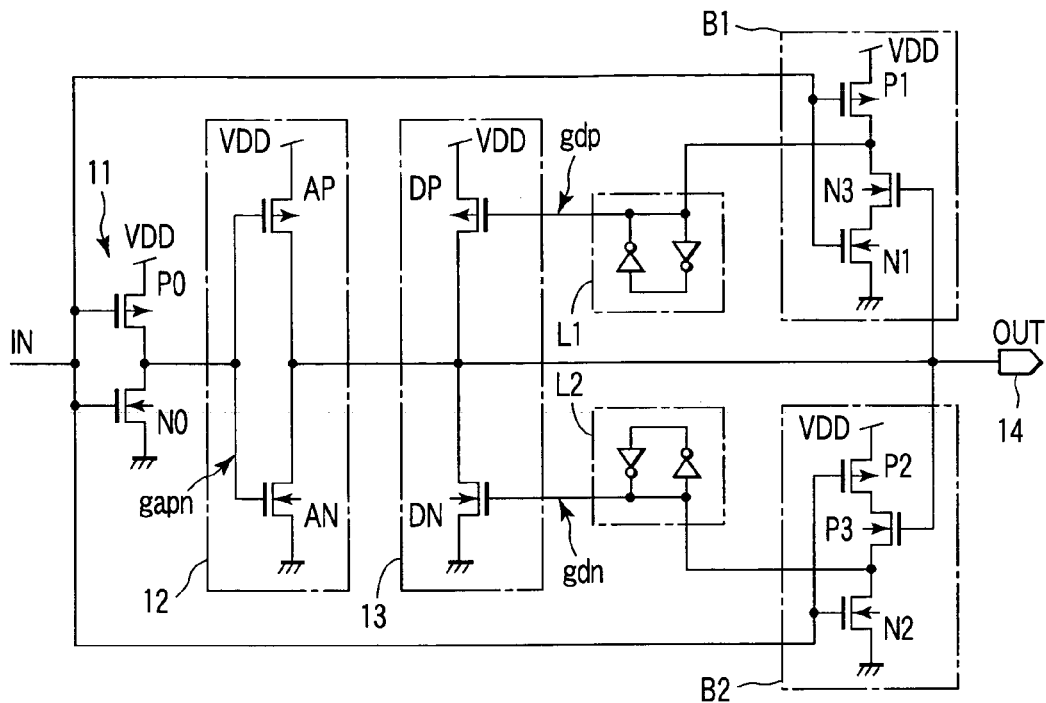
FIG. 1 is a circuit diagram showing typical one of a plurality of CMOS output buffer circuits according to a first embodiment of the present invention, which are built in LSI and simultaneously driven.

FIG. 1 is a circuit diagram showing typical one of a plurality of CMOS output buffer circuits according to a first embodiment of the present invention, which are built into an LSI and simultaneously driven.

The CMOS output buffer circuit shown in FIG. 1 has the configuration described below. A back-stage output buffer of a pre-buffer 11 is divided into drive buffer 12 and back-up buffer 13 having their output nodes connected in common. In order to control the back-up buffer 13, first and second bias circuits B1, B2, first and second latch circuits L1 and L2 are additionally provided.

As shown in FIG. 1, the pre-buffer 11 has PMOS and NMOS buffers individually comprising PMOS and NMOS transistors P0 and N0, which are connected in series between a power supply node (VDD node) to which power supply voltage VDD is applied and a ground node. The PMOS and NMOS buffers have a gate connected in common, and are complementarily turned on by an input signal IN from a front-stage circuit (not shown).

The drive buffer 12 has PMOS and NMOS buffers individually comprising PMOS and NMOS transistors AP and AN, which are connected in series between the VDD node and the ground node. The PMOS and NMOS buffers each have a gate to which an output signal (control signal gapn) of the pre-buffer 11 is inputted so that these PMOS and NMOS buffers are complementarily turned on. The series-connection node of the PMOS and NMOS transistors AP and AN is connected to a buffer circuit output node 14.

The back-up buffer 13 has PMOS and NMOS buffers individually comprising PMOS and NMOS transistors DP and DN, which are connected in series between the VDD node and the ground node. Control signals gdp and gdn are inputted to the corresponding gate. The series-connection node of the PMOS and NMOS transistors DP and DN is connected to the buffer circuit output node 14. In this case, the control signal gdp is generated by first bias circuit B1 and first latch circuit L1. On the other hand, the control signal gdn is generated by second bias circuit B2 and second latch circuit L2.

The first bias circuit B1 has PMOS transistor P1, NMOS transistors N3 and N1, which are connected in series between the VDD node and the ground node. The PMOS and NMOS transistors P1 and N1 have a commonly connected gate, and are complementarily turned on by the input signal IN. The potential (voltage) of the buffer circuit output node 14 is inputted to the gate is of the NMOS transistor N3. The potential of the series-connection node of the PMOS and NMOS transistors P1 and N3 is used as the control signal gdp supplied to the gate of the PMOS transistor DP.

In this case, to prevent the gate level of the PMOS transistor DP from becoming unstable even if a voltage is externally applied to the buffer circuit output node 14, the first latch circuit L1 latches the potential of the series-connection node of the PMOS and NMOS transistors P1 and N3 of the first bias circuit B1.

The second bias circuit B2 has PMOS transistors P2, P3 and NMOS transistor N2, which are connected in series between the VDD node and the ground node. The PMOS and NMOS transistors P2 and N2 have a commonly connected gate, and are complementarily turned on by the input signal IN. The potential (voltage) of the buffer circuit output node 14 is inputted to the gate of the PMOS transistor P3. The potential of the series-connection node of the PMOS and NMOS transistors P3 and N2 is used as the control signal gdn supplied to the gate of the NMOS transistor DN.

In this case, to prevent the gate level of the NMOS transistor DN from becoming unstable even if a voltage is externally applied to the buffer circuit output node 14, the second latch circuit L2 latches the potential of the series-connection node of the PMOS and NMOS transistors P3 and N2 of the first bias circuit B1.

Figure 2:
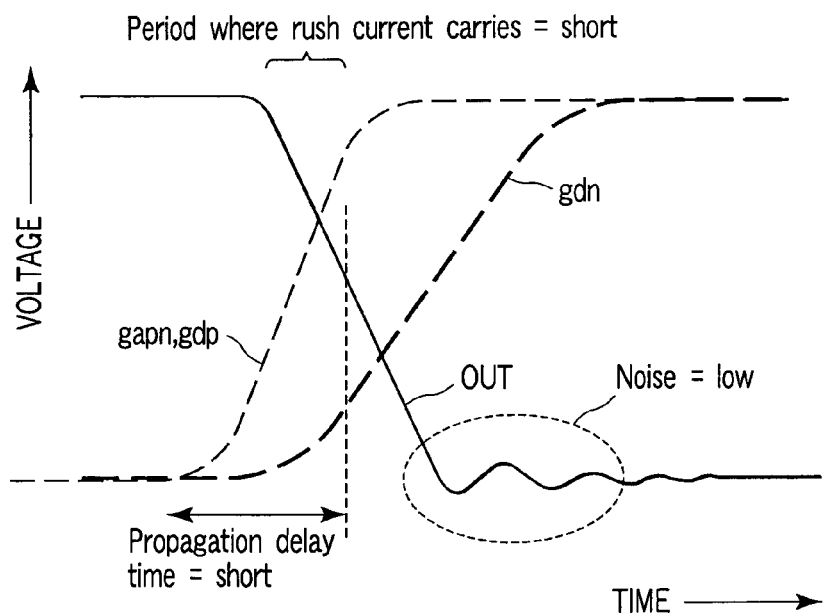
FIG. 2 is a waveform chart to explain input signal IN, control signals gapn, gdp gdn, output signal OUT and switching noise in the switching operation when an input signal of the output buffer circuit shown in FIG. 1 falls.

FIG. 2 is a waveform chart to explain input signal IN, control signals gapn, gdp gdn, output signal OUT and switching noise in the switching operation when an input signal of the output buffer circuit shown in FIG. 1 falls.

In the initial state that the input signal IN is "H" level, the PMOS transistor P0 of the pre-buffer 11 receiving the input signal IN is in a turned off state while the NMOS transistor N0 of the pre-buffer 11 also receiving the input signal IN is in a turned on state, and the gate control signal gapn of the drive buffer 12 is "L" level. Thus, the PMOS transistor AP of the drive buffer 12 is in a turned on state while the NMOS transistor AN thereof is in a turned off state.

At that time, in the first bias circuit B1, the PMOS transistor P1 receiving the input signal IN is in a turned off state while the NMOS transistor N1 also receiving the input signal IN is in a turned on state. In addition, the NMOS transistor N3 receiving the output signal OUT ("H" level) is in a turned on state. The first latch circuit L1 latches the potential ("L" level) of the series-connection node of the PMOS and NMOS transistors P1 and N3; therefore, the control signal gdp becomes "L" level. Thus, the PMOS transistor DP of the back-up buffer 13 receiving the control signal gdp is in a turned on state.

On the other hand, in the second bias circuit B2, the PMOS transistor P2 receiving the input signal IN is in a turned off state while the PMOS transistor P3 receiving the output signal OUT ("H" level) is in a turned off state. In addition, the NMOS transistor N2 also receiving the input signal IN is in a turned on state. The second latch circuit L2 latches the potential ("L" level) of the series-connection node of the PMOS and NMOS transistors P3 and N2; therefore, the control signal gdn becomes "L" level. Thus, the NMOS transistor DN of the back-up buffer 13 receiving the control signal gdn is in a turned off state.

When the input signal IN falls from the state described above, that is, from "H" level to "L" level, the PMOS transistor P0 of the pre-buffer 11 receiving the input signal IN is inverted from the turned off state to the turned on state, while the NMOS transistor N0 of the pre-buffer 11 also receiving the input signal IN is inverted from the turned on state to the turned off state. Therefore, the gate control signal gapn of the drive buffer 12 is inverted from "L" level to "H" level. In this way, the PMOS transistor AP of the drive buffer 12 is inverted from the turned on state to the turned off state while the NMOS transistor AN thereof is inverted from the turned off state to the turned on state.

Simultaneously with the operation described above, in the first bias circuit B1, the PMOS transistor P1 receiving the input signal IN is inverted from the turned off state to the turned on state while the NMOS transistor N1 also receiving the input signal IN is inverted from the turned on state to the turned off state. Thus, the potential of the series-connection node of the PMOS and NMOS transistors P1 and N3 is inverted from "L" level to "H" level. The "H" level potential is latched by the first latch circuit L1, and the control signal gdp is inverted from "L" level to "H" level. In this way, the PMOS transistor DP of the back-up buffer 13, for receiving the control signal gdp, is quickly inverted from the turned on state to the turned off state, and the output signal OUT is changed from "H" level to "L" level.

On the other hand, in the second bias circuit B2, the PMOS transistor P2 receiving the input signal IN is inverted from the turned off state to the turned on state while the NMOS transistor N2 also receiving the input signal IN is inverted from the turned on state to the turned off state. In this case, the control signal gdn is held at a state close to the "L" level by the second latch circuit L2 latching the potential ("L" level) of the series-connection node of the PMOS and NMOS transistors P3 and N2, until the potential of the "L" level of the output signal OUT is sufficiently applied to the gate of the PMOS transistor P3 as a gate bias thereto. Therefore, the NMOS transistor DN of the back-up buffer 13 receiving the control signal gdn is held at the turned off state. Thereafter, when the potential of the "L" level of the output signal OUT is sufficiently applied to the gate of the PMOS transistor P3 as a gate bias thereto, the PMOS transistor P3 is inverted from the turned off state to the turned on state, and the potential of the series-connection node of the PMOS and NMOS transistors P3 and N2 is inverted from "L" level to "H" level. The second latch circuit L2 latches this potential, so that the control signal gdn is inverted from "L" level to "H" level. Therefore, the NMOS transistor DN of the back-up buffer 13 receiving the control signal gdn is inverted from the turned off state to the turned on state.

The switching operation when the input signal IN of the output buffer circuit shown in FIG. 1 rises is carried out in a corresponding manner to the switching operation when the input signal IN of the output buffer circuit falls.

When the input signal IN rises from "L" level to "H" level, the PMOS transistor P0 of the pre-buffer 11 receiving the input signal IN is inverted from the turned on state to the turned off state, while the NMOS transistor N0 of the pre-buffer 11 also receiving the input signal IN is inverted from the turned off state to the turned on state. Therefore, the gate control signal gapn of the drive buffer 12 is inverted from "H" level to "L" level. In this way, the PMOS transistor AP of the drive buffer 12 is inverted from the turned off state to the turned on state while the NMOS transistor AN thereof is inverted from the turned on state to the turned off state.

Simultaneously with the operation described above, in the second bias circuit B2, the PMOS transistor P2 receiving the input signal IN is inverted from the turned on state to the turned off state while the NMOS transistor N2 also receiving the input signal IN is inverted from the turned off state to the turned on state. Thus, the potential of the series-connection node of the PMOS and NMOS transistors P3 and N2 is inverted from "H" level to "L" level. This potential is latched by the second latch circuit L2, and the control signal gdn is inverted from "H" level to "L" level. In this way, the NMOS transistor DN of the back-up buffer 13, for receiving the control signal gdn, is quickly inverted from the turned on state to the turned off state, and the output signal OUT is changed from "L" level to "H" level.

On the other hand, in the first bias circuit B1, the PMOS transistor P1 receiving the input signal IN is inverted from the turned on state to the turned off state while the NMOS transistor N1 also receiving the input signal IN is inverted from the turned off state to the turned on state. In this case, the control signal gdp is held at a state close to the "H" level, until the potential of the "H" level of the output signal OUT is sufficiently applied to the gate of the NMOS transistor N3 as a gate bias thereto. Therefore, the PMOS transistor DP of the back-up buffer 13 receiving the control signal gdp is held at the turned off state.

Thereafter, when the potential of the "H" level of the output signal OUT is sufficiently applied to the gate of the NMOS transistor N3 as a gate bias thereto, the NMOS transistor N3 is inverted from the turned off state to the turned on state, and the potential of the series-connection node of the PMOS and NMOS transistors P1 and N3 is inverted from "H" level to "L" level. The first latch circuit L1 latches this potential, so that the control signal gdp is inverted from "H" level to "L" level. Therefore, the PMOS transistor DP of the back-up buffer 13 receiving the control signal gdp is inverted from the turned off state to the turned on state.

The first and second latch circuits L1 and L2 of the first and second bias circuits B1 and B2 function to hold stable the logic levels of the gate control signal gdp and gdn, respectively, inputting the back-up buffer 13, even if a voltage is externally applied to the buffer circuit output node 14 so that the NMOS transistors N3 of the first bias circuit B1 and the PMOS transistor P3 of the second bias circuit B2 are cut off.

The output buffer circuit of the first embodiment has the following features. When the level of the input signal IN is inverted, one of PMOS and NMOS transistors DP and DN of the back-up buffer 13 is quickly turned off, and thereafter, the other is turned on late. Thus, there exists almost no rush current between buffers in the switching operation, unlike the conventional SRC circuit described in the Related Art. Therefore, it is possible to reduce switching noise without influencing the propagation delay time.

In addition, the turn-on timing of the drive buffer 12 and the back-up buffer 13 is intentionally changed. In this way, even if the drive capability of the output buffer circuit is high, it is possible to prevent rapid current variations in the switching operation through a capacitance load, not shown, of the output side of the buffer circuit to some degree. This serves to reduce the switching noise; therefore, it is possible to reduce the influence on the LSI inside and outside.

SECOND EMBODIMENT

Figure 3:
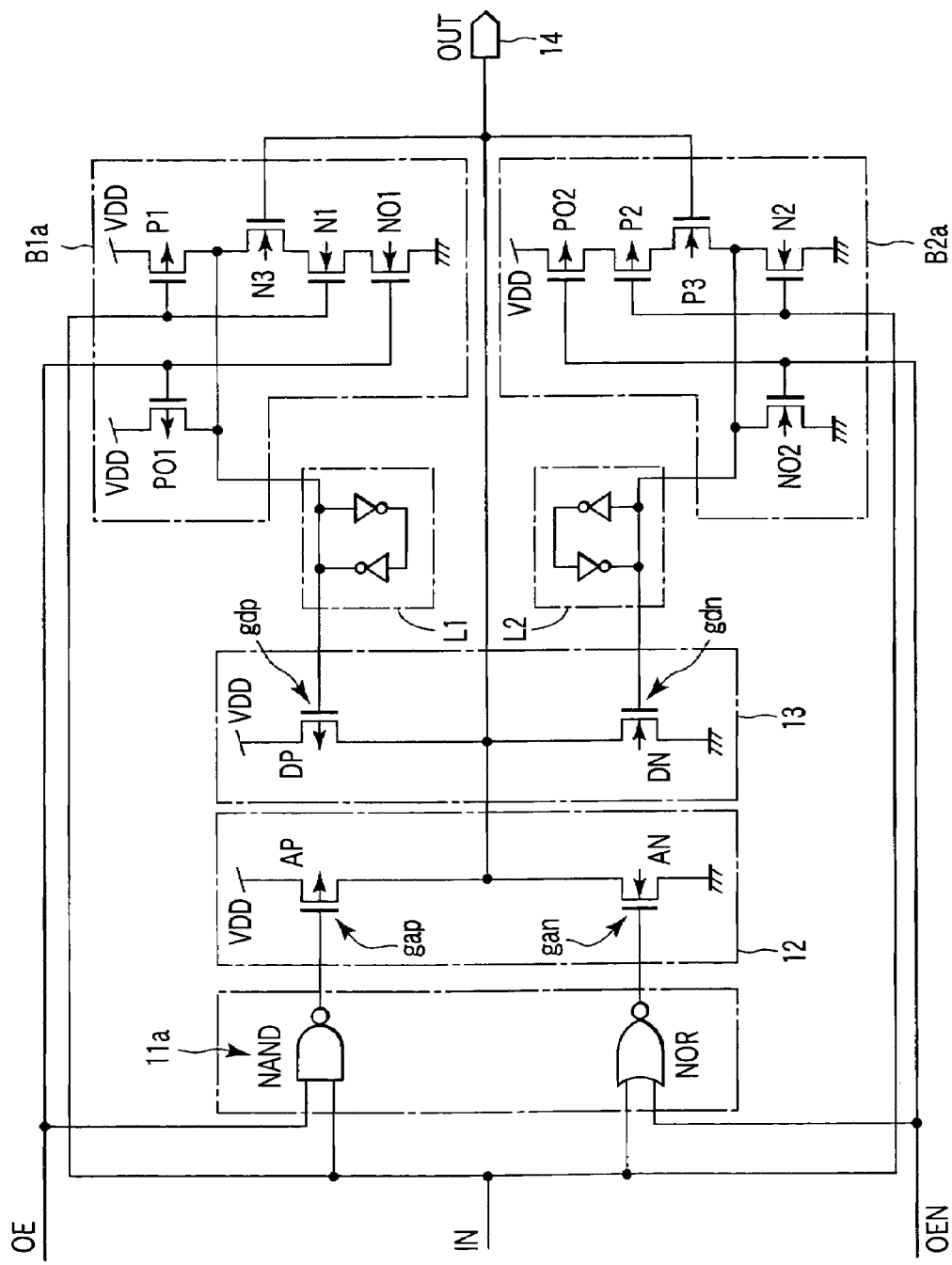
FIG. 3 is a circuit diagram showing typical one of a plurality of CMOS output buffer circuits according to a second embodiment of the present invention, which are built in LSI and simultaneously driven.
Figure 8:
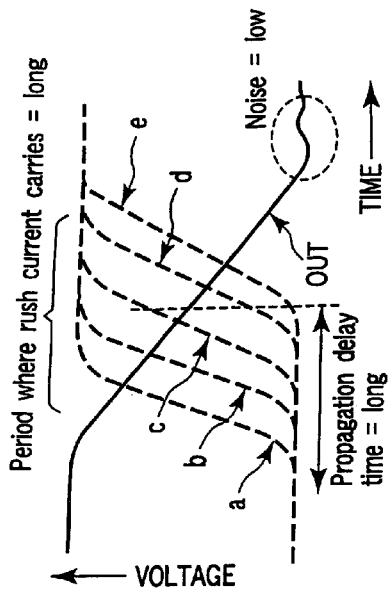
FIG. 8 is a waveform chart of the circuit shown in FIG. 7 to explain the delay propagation operation with respect to multi-stage PMOS and NMOS transistors PT and NT of the output buffer when the input signal rises.
Figure 7:
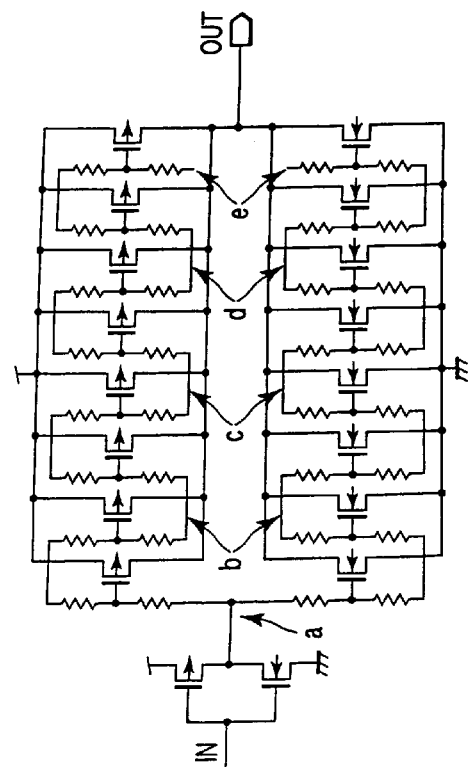
FIG. 7 is an equivalent circuit diagram of the SRC circuit shown in FIG. 6 to which input signal propagation path nodes are added.
Figure 10:
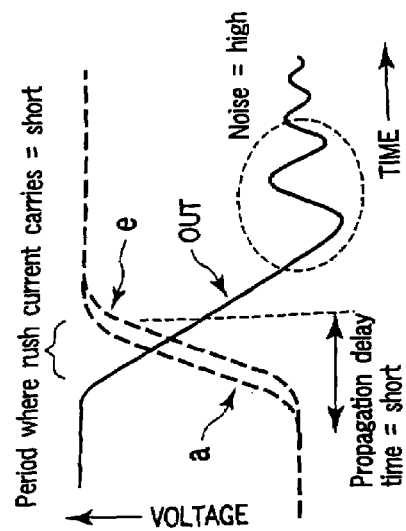
FIG. 10 is a waveform chart of the circuit shown in FIG. 9 to explain the operation waveform when the input signal falls.
Figure 9:
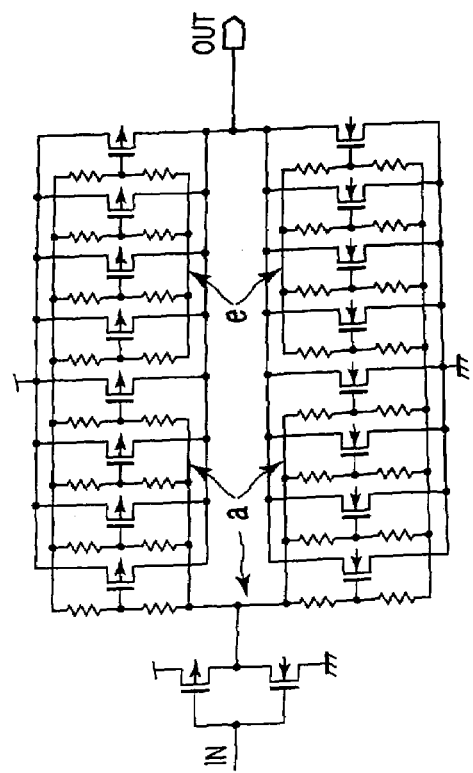
FIG. 9 is an equivalent circuit diagram showing a modification example of the SRC circuit shown in FIG. 7.

FIG. 3 is a circuit diagram showing typical one of a plurality of CMOS output buffer circuits according to a second embodiment of the present invention, which are built into an LSI and simultaneously driven.

The CMOS output buffer circuit shown in FIG. 3 is a three-state output buffer circuit, which is controlled by complementary output enable signals OE and OEN. The CMOS output buffer circuit shown in FIG. 3 differs from the CMOS output buffer circuit described in FIG. 1 in the following points. Pre-buffer 11a, first and second bias circuits B1a and B1b have a configuration different from the CMOS output buffer circuit of FIG. 1. Other drive buffer 12, back-up buffer 13, first and second latch circuits L1 and L2 are the same as described in FIG. 1.

As shown in FIG. 3, the pre-buffer 11a is composed of an NAND gate circuit NAND to which an input signal IN and a signal OE are inputted, and a NOR gate circuit NOR to which the input signal IN and a signal OEN are inputted. An output signal gap of the NAND gate circuit NAND is inputted to the PMOS transistor AP of the drive buffer 12. An output signal gan of the NOR gate circuit NOR is inputted to the NMOS transistor AN of the drive buffer 12.

The first bias circuit B1a has PMOS transistor P1, NMOS transistors N3, N1 and N01, which are connected in series between the VDD node and the ground node. A PMOS transistor P01 is connected between the VDD node and the drain of the PMOS transistor P1. The PMOS and NMOS transistors P1 and N1 have a commonly connected gate, and are complementarily turned on by the input signal IN. The PMOS and NMOS transistors P01 and N01 have a commonly connected gate, and are complementarily turned on by the signal OE. The potential of the buffer circuit output node 14 is inputted to the gate of the NMOS transistor N3. The potential of a series-connection node of the PMOS and NMOS transistors P1 and N3 is latched by the first latch circuit L1, and used as the control signal gdp.

The second bias circuit B2a has PMOS transistors P02, P2, P3 and NMOS transistor N2, which are connected in series between the VDD node and the ground node. An NMOS transistor N02 is connected between the drain of the NMOS transistor N2 and the ground node. The PMOS and NMOS transistors P2 and N2 have a commonly connected gate, and are complementarily turned on by the input signal IN. The PMOS and NMOS transistors P02 and N02 have a commonly connected gate, and are complementarily turned on by the signal OEN. The potential of the buffer circuit output node 14 is inputted to the gate of the PMOS transistor P3. The potential of a series-connection node of the PMOS and NMOS transistors P3 and N2 is latched by the second latch circuit L2, and used as the control signal gdn.

The three-state output buffer circuit of the second embodiment makes the following operation. More specifically, when the signals OE and OEN are "H"/"L", respectively (active state), the output signal gap of the NAND gate circuit NAND of the pre-buffer 11a becomes "L"/"H" level in accordance with "H"/"L" level of the input signal IN. Thus, the PMOS transistor AP of the drive buffer 12 becomes turned on/off state. The output signal gan of the NOR gate circuit NOR of the pre-buffer 11a becomes "L"/"H" level in accordance with "H"/"L" level of the input signal IN. Thus, the NMOS transistor AN of the drive buffer 12 becomes turned off/on state.

At that time, PMOS and NMOS transistors P01 and N01 of the first bias circuit B1a become turned off/on state, respectively. On the other hand, PMOS and NMOS transistors P02 and N02 of the second bias circuit B2a become turned on/off state, respectively.

In this state, drive buffer 12, back-up buffer 13, first and second bias circuits B1a and B2a, first and second latch circuits L1 and L2 make the same operation as the output buffer circuit described in FIG. 2. Therefore, the same effect is obtained.

Conversely, when the signals OE and OEN are "L"/"H", respectively (non-active state), the output signal gap of the NAND gate circuit NAND of the pre-buffer 11a becomes "H" level regardless of "H"/"L" level of the input signal IN. Thus, the PMOS transistor AP of the drive buffer 12 becomes turned off state. The output signal gan of the NOR gate circuit NOR of the pre-buffer 11a becomes "L" level regardless of "H"/"L" level of the input signal IN. Thus, the NMOS transistor AN of the drive buffer 12 becomes turned off state. In this way, the output node of the drive buffer 12 becomes high impedance state.

In this state, PMOS and NMOS transistors P01 and N01 of the first bias circuit B1a become turned on/off state, respectively. On the other hand, PMOS and NMOS transistors P02 and N02 of the second bias circuit B2a become turned off/on state, respectively. Thus, the outputs of the first bias circuit B1a and the first latch circuit L1 are fixed to "H" level; therefore, the PMOS transistor DP of the back-up buffer 13 becomes turned off state. On the other hand, the outputs of the second bias circuit B2a and the second latch circuit L2 is fixed to "L" level; therefore, the NMOS transistor DN of the back-up buffer 13 becomes turned off state. In this way, the output node 14 of the back-up buffer 13 becomes high impedance state. As a result, the buffer circuit output node becomes high impedance state.

According to the foregoing embodiments, it is possible to a semiconductor integrated circuit including a CMOS output buffer circuit, which has a short signal propagation delay time, and reduces switching noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
an input node and an output node;
a pre-buffer having a NAND gate circuit and a NOR gate circuit, the NAND gate circuit being inputted with an input signal from a front-stage circuit through the input node and an output enable signal, and the NOR gate circuit being inputted with an inversion signal of the output enable signal and the input signal;
a drive buffer having a first PMOS transistor and a first NMOS transistor connected in series between a power supply node and a ground node, the first PMOS transistor having a gate for receiving an output signal of the NAND gate circuit of the pre-buffer, the first NMOS transistor having a gate for receiving an output signal of the NOR gate circuit of the pre-buffer, a series-connection node of the first PMOS transistor and the first NMOS transistor being connected to the output node;
a back-up buffer having a second PMOS transistor and a second NMOS transistor connected in series between the power supply node and the ground node, a senes-connection node of the second PMOS transistor and the second NMOS transistor being connected to the output node, one of the second PMOS transistor and the second NMOS transistor is turned on after the other of the second PMOS transistor and the second NMOS transistor is turned off when the drive buffer is in a switching operation;
a first bias circuit configured to receive a potential of the input signal of the input node and a potential of the output node to generate a first control potential;
a first latch circuit configured to receive and latch the first control potential;
a second bias circuit configured to receive the potential of the input signal of the input node and the potential of the output node to generate a second control potential different from the first control potential in timing of change; and
a second latch circuit configured to receive and latch the second control potential,
wherein the first control potential latched by the first latch circuit is inputted to a gate of the second PMOS transistor of the back-up buffer and the second control potential latched by the second latch circuit is inputted to a gate of the second NMOS transistor of the back-up buffer.

2. A semiconductor integrated circuit device according to claim 1, wherein the pre-buffer, the drive buffer, the back-up buffer, the first bias circuit, the first latch circuit, the second bias circuit and the second latch circuit constitute a buffer circuit, the semiconductor integrated circuit device further comprising a plurality of the buffer circuits including the buffer circuit, having the same structure as the buffer circuit, wherein the plurality of buffer circuits simultaneously output a plurality of bits.

3. A semiconductor integrated circuit device according to claim 1, wherein the first bias circuit having a third PMOS transistor, a third NMOS transistor, a fourth NMOS transistor and a fifth NMOS transistor being connected in series between the power supply node and the ground node, the first bias circuit further having a fourth PMOS transistor connected between the power supply node and a drain of the third PMOS transistor, the third PMOS transistor and the fourth NMOS transistor having gates for receiving the input signal, the third NMOS transistor having a gate for receiving the potential of the output node, the fourth PMOS transistor and the fifth NMOS transistor having gates for receiving the output enable signal, a potential of a series-connection node of the third PMOS transistor and the third NMOS transistor being latched by the first latch circuit; and the second bias circuit having a fifth PMOS transistor, a sixth PMOS transistor, a seventh PMOS transistor and a sixth NMOS transistor being connected in series between the power supply node and the ground node, the second bias circuit further having a seventh PMOS transistor connected between the ground node and a drain of the sixth NMOS transistor, the six PMOS transistor and the sixth NMOS transistor having gates for receiving the input signal, the seventh PMOS transistor having a gate for receiving the potential of the output node, the fifth PMOS transistor and the seventh NMOS transistor having gates for receiving an inversion signal of the output enable signal, a potential of a series-connection node of the seventh PMOS transistor and the sixth NMOS transistor being latched by the second latch circuit.

4. A semiconductor integrated circuit device according to claim 3, wherein the pre-buffer, the drive buffer, the back-up buffer, the first bias circuit, the first latch circuit, the second bias circuit and the second latch circuit constitute a buffer circuit, the semiconductor integrated circuit device further comprising a plurality of the buffer circuits including the buffer circuit, having the same structure as the buffer circuit, wherein the plurality of buffer circuits simultaneously output a plurality of bits.

5. A semiconductor integrated circuit device comprising:
an input node and an output node;
a pre-buffer having a NAND gate circuit and a NOR gate circuit, the NAND gate circuit being inputted with an input signal from a front-stage circuit through the input node and an output enable signal, and the NOR gate circuit being inputted with an inversion signal of the output enable signal and the input signal;
a drive buffer having a first PMOS transistor and a first NMOS transistor connected in series between a power supply node and a ground node, the first PMOS transistor having a gate for receiving an output signal of the NAND gate circuit of the pre-buffer, the first NMOS transistor having a gate for receiving an output signal of the NOR gate circuit of the pre-buffer, a series-connection node of the first PMOS transistor and the first NMOS transistor being connected to the output node; and
a first bias circuit configured to receive a potential of the input signal of the input node and a potential of the output node to generate a first control potential;
a second bias circuit configured to receive the potential of the input signal of the input node and the potential of the output node to generate a second control potential different from the first control potential in timing of change;
a back-up buffer having a second PMOS transistor and a second NMOS transistor connected in series between the power supply node and the ground node, a series-connection node of the second PMOS transistor and the second NMOS transistor being connected to the output node, the second PMOS transistor having a gate for receiving the first control potential generated by first bias circuit, the second NMOS transistor having a gate for receiving the second control potential generated by second bias circuit, one of the second PMOS transistor and the second NMOS transistor is turned on after the other of the second PMOS transistor and the second NMOS transistor is turned off when the drive buffer is in a switching operation.

6. A semiconductor integrated circuit device according to claim 5, wherein the pre-buffer, the drive buffer, and the back-up buffer constitute a buffer circuit, the semiconductor integrated circuit device further comprising a plurality of the buffer circuits including the buffer circuit, having the same structure as the buffer circuit, wherein the plurality of buffer circuits simultaneously output a plurality of bits.

7. A semiconductor integrated circuit device according to claim 5, wherein the first bias circuit having a third PMOS transistor, a third NMOS transistor, a fourth NMOS transistor and a fifth NMOS transistor being connected in series between the power supply node and the ground node, the first bias circuit further having a fourth PMOS transistor connected between the power supply node and a drain of the third PMOS transistor, the third PMOS transistor and the fourth NMOS transistor having gates for receiving the input signal, the third NMOS transistor having a gate for receiving the potential of the output node, the fourth PMOS transistor and the fifth NMOS transistor having gates for receiving the output enable signal; and the second bias circuit having a fifth PMOS transistor, a sixth PMOS transistor, a seventh PMOS transistor and a sixth NMOS transistor being connected in series between the power supply node and the ground node, the second bias circuit further having a seventh PMOS transistor connected between the ground node and a drain of the sixth NMOS transistor, the six PMOS transistor and the sixth NMOS transistor having gates for receiving the input signal, the seventh PMOS transistor having a gate for receiving the potential of the output node, the fifth PMOS transistor and the seventh NMOS transistor having gates for receiving an inversion signal of the output enable signal.

8. A semiconductor integrated circuit device according to claim 7, wherein the pre-buffer, the drive buffer, the back-up buffer, the first bias circuit and the second bias circuit constitute a buffer circuit, the semiconductor integrated circuit device further comprising a plurality of the buffer circuits including the buffer circuit, having the same structure as the buffer circuit, wherein the plurality of buffer circuits simultaneously output a plurality of bits.

* * * * *